(12) United States Patent
Billieres (10) Patent No.: US 9,951,413 B2
(45) Date of Patent: *Apr. 24, 2018

(54) MOLYBDENUM-BASED TARGET AND PROCESS FOR PRODUCING A TARGET BY THERMAL SPRAYING

(75) Inventor: Dominique Billieres, Saint-Saturnin Les Avignon (FR)

(73) Assignee: SAINT-GOBAIN COATING SOLUTIONS, Avignon (FR)

( * ) Notice: Subject to any disclaimer, the term of this patent is extended or adjusted under 35 U.S.C. 154(b) by 1479 days.

This patent is subject to a terminal disclaimer.

(21) Appl. No.: 13/259,975

(22) PCT Filed: Apr. 12, 2010

(86) PCT No.: PCT/FR2010/050703
§ 371 (c)(1),
(2), (4) Date: Nov. 29, 2011

(87) PCT Pub. No.: WO2010/116111
PCT Pub. Date: Oct. 14, 2010

(65) Prior Publication Data
US 2012/0063947 A1 Mar. 15, 2012

(30) Foreign Application Priority Data
Apr. 10, 2009 (FR) ...................................... 09 52392

(51) Int. Cl.
| | |
|---|---|
| *C23C 4/08* | (2016.01) |
| *C23C 14/34* | (2006.01) |
| *C23C 14/06* | (2006.01) |
| *C23C 14/18* | (2006.01) |
| *C23C 4/067* | (2016.01) |
| *C23C 4/137* | (2016.01) |

(52) U.S. Cl.
CPC .......... *C23C 14/3414* (2013.01); *C23C 4/067* (2016.01); *C23C 4/08* (2013.01); *C23C 4/137* (2016.01); *C23C 14/0682* (2013.01); *C23C 14/185* (2013.01)

(58) Field of Classification Search
CPC .. C23C 4/00; C23C 4/06; C23C 4/065; C23C 4/08; C23C 4/12; C23C 4/127; C23C 4/128; C23C 14/06; C23C 14/0682; C23C 14/14; C23C 14/16; C23C 14/165; C23C 14/18; C23C 14/185; C23C 14/34; C23C 14/3407; C23C 14/3414; C23C 16/453
See application file for complete search history.

(56) References Cited

U.S. PATENT DOCUMENTS

| | | | |
|---|---|---|---|
| 4,356,073 A | 10/1982 | McKelvey et al. | |
| 4,619,697 A * | 10/1986 | Hijikata et al. ... | C04B 35/58085 204/291 |
| 4,750,932 A * | 6/1988 | Parent ............... | C04B 35/58092 204/292 |
| 5,354,446 A * | 10/1994 | Kida ..................... | C03C 17/245 204/298.12 |
| 2005/0230244 A1 | 10/2005 | Inoue et al. | |
| 2005/0279630 A1* | 12/2005 | Fonte .................. | C23C 14/3414 204/298.21 |
| 2006/0042728 A1* | 3/2006 | Lemon et al. ................ | 148/668 |
| 2006/0233965 A1 | 10/2006 | Boulos et al. | |
| 2007/0023899 A1 | 2/2007 | Yudasaka | |
| 2008/0078268 A1* | 4/2008 | Shekhter ............... | B22F 1/0085 75/255 |
| 2008/0087359 A1* | 4/2008 | Zurecki ..................... | C23C 4/02 148/511 |
| 2008/0138620 A1* | 6/2008 | Nadaud et al. ............... | 428/402 |
| 2008/0193798 A1 | 8/2008 | Lemon et al. | |
| 2008/0271779 A1* | 11/2008 | Miller et al. .................. | 136/252 |
| 2009/0139862 A1* | 6/2009 | De Bosscher ...... | C23C 14/0036 204/298.13 |
| 2009/0238712 A1 | 9/2009 | Inoue et al. | |

FOREIGN PATENT DOCUMENTS

| | | | |
|---|---|---|---|
| DE | 43 39 345 | 5/1995 | |
| EP | 1 748 491 | 1/2007 | |
| WO | WO 2006/026621 A2 | 3/2006 | |
| WO | WO 2006/041730 A2 | 4/2006 | |
| WO | WO 2006085020 A1 * | 8/2006 | ......... C23C 14/3414 |
| WO | WO 2006/117145 A2 | 11/2006 | |
| WO | 2007 141174 | 12/2007 | |
| WO | WO 2007141174 A1 * | 12/2007 | ......... C23C 14/0036 |
| WO | WO 2008046039 A2 * | 4/2008 | ............... C23C 4/02 |

OTHER PUBLICATIONS

Pawlowski, L. (2008) Materials Used for Spraying, in the Science and Engineering of Thermal Spray Coatings, Second Edition, John Wiley & Sons, Ltd, Chichester, UK.*
International Search Report dated Aug. 31, 2010 in PCT/FR10/050703 filed Apr. 12, 2010.
French Search Report dated Sep. 9, 2009 in French Patent Application 0952392 filed Apr. 10, 2009.

* cited by examiner

*Primary Examiner* — Roy V King
*Assistant Examiner* — Jophy S. Koshy
(74) *Attorney, Agent, or Firm* — Oblon, McClelland, Maier & Neustadt, L.L.P.

(57) ABSTRACT

A target of a nominal thickness includes molybdenum. The target has a lamellar microstructure and an oxygen content of less than 1000 ppm, preferably less than 600 ppm, and even more preferably less than 450 ppm. An electrical resistivity of the target is less than five times, preferably three times and more preferably twice the theoretical electrical resistivity of the compound.

11 Claims, 3 Drawing Sheets

MOLYBDENUM-BASED TARGET AND PROCESS FOR PRODUCING A TARGET BY THERMAL SPRAYING

BACKGROUND OF THE INVENTION

Field of the Invention

The present invention relates to a process for producing a target intended to be used in deposition processes carried out in a vacuum or in an inert or reactive atmosphere, especially by magnetron sputtering or by ion beam sputtering.

According to another aspect of the invention, it also relates to a molybdenum-based target possibly obtained by implementing said process and to the use of such a target for the purpose of obtaining films based on the material sputtered from said target, and also to a composition of the compound for producing said target by the process according to the invention.

Description of Related Art

Various techniques for manufacturing targets, including certain powder forming techniques, are known. Thus, the targets in question may result from a casting process or a powder sintering process followed by forming operations, often hot forming, and then assembly on a support, or direct assembly of sintered segments, or less conventionally a technique of thermal spraying and more particularly a plasma spraying technique.

These targets are intended to be used in processes commonly employed on an industrial scale for thin film deposition, especially on a glass substrate, such as for example the magnetron sputtering process. In this process, a plasma is created in a high vacuum close to a target comprising the chemical elements to be deposited. The active species of the plasma, by bombarding the target, tear off said elements, which are deposited on the substrate, forming the desired thin film.

In the specific case of a target intended for depositing molybdenum, a nonreactive deposition process is used in which the plasma is composed only of a sputtering gas, preferably a noble gas of the Ar, Kr, Xe or Ne type. This process is implemented for large substrates and may enable thin films to be deposited on substrates, for example flat glass sheets with sides of more than 6 m in length.

These targets have a planar geometry or a tubular geometry.

Planar targets have the advantage of being able to be integrated in cathodes of relatively simple architecture compared with cathodes dedicated to rotary targets, which are much more complex. However, planar targets have a utilization factor which is generally 50% or less, which is not the case for rotary targets that have a utilization factor substantially greater than 50%.

In the specific case of thin molybdenum films, molybdenum being a particularly expensive metal, it is preferred to use rotary targets of cylindrical geometry, as described in the U.S. Pat. No. 4,356,073 since these targets have a material yield (representing the proportion of sputtered material relative to the amount of material available on the target for producing a thin film) of greater than 70%, preferably greater than 75%. However, various other magnetron target geometries are known: planar (disk, square, rectangular) geometries and the invention is also applicable to geometries other than cylindrical ones.

The following literature data for pure molybdenum are given below:
density: 10.28 g/cm$^3$;
thermal expansion: 4.8×10$^{-6}$ K$^{-1}$;
Young's modulus: 324 N/mm$^2$;
electrical resistivity: 5.34 μohms·cm;
thermal conductivity: 139 W/mK;
melting point: 2630° C.

Furthermore, there are also other vacuum processes for depositing molybdenum other than magnetron sputtering using a target: these include laser sputtering (laser ablation using a pulsed or continuous laser) and ion beam sputtering for example. These processes may also benefit from the use of a target according to the invention.

As regards more particularly molybdenum magnetron targets or those made of other refractory metals, many inventions have been filed relating to the following processes and forming the subject matter of the patent applications listed below:

Patent applications EP 1 784 518, US 2008/0193798 and WO 2006/041730:

Pressing then sintering of an ingot or a preform (under a pressure of 200 to 250 MPa and at a temperature of 1780 to 2175° C.) followed by hot forming (at about 900° C.) of this preform by rolling or extrusion or forging. Generally, this process also includes a heat treatment in hydrogen or a reducing atmosphere in order to reduce the oxide content in the target and optionally a stress relaxation annealing treatment.

Also known, from patent application WO 2006/117145, is the complete or partial construction, or restoration, of targets by cold spraying, which consists in spraying a gas/powder mixture at supersonic velocity, the powder not being in the molten state, thereby differing from the thermal spraying processes.

Although the above documents also cover the production of targets having various compositions using these methods, pure molybdenum targets usually have the following properties:

purity: >99.95%;
density: >95% of the theoretical density;
fine-grained microstructure.

Targets having these characteristics are sputtered so as to obtain thin films that are used for example as electrodes for photovoltaic applications based on an active material belonging to the chalcopyrite family (CIS or CIGS for example). Molybdenum provides a good compromise between electrical conductivity (less than 30 μohms·cm), temperature resistance (refractory properties: melting point: 2610° C.) and high selenization resistance. This is because molybdenum has a higher resistance to the selenium-rich atmosphere used during the CIS or CIGS deposition step, molybdenum reacting on the surface with selenium to form an $MoSe_2$ passivating layer without losing its electrical conduction properties, or else for TFT (thin film transistor) applications that require extremely low defect ("pinhole") densities. Maximum pinhole densities of 500/m$^2$ with a size between 1 and 5 μm may especially be mentioned. Such quality levels can be achieved only if the sputtering process is devoid of any electrical instability of the arcing type. This is especially possible when the target has significantly no porosity, i.e. with a density of at least 90%.

BRIEF SUMMARY OF THE INVENTION

Although the processes for obtaining a target by plasma spraying are known not to give properties similar to those obtained previously, the present invention is applicable to a process for producing a molybdenum-based target by plasma spraying that offers performance in use at least equal to, if not better than, that obtained by conventional manufacturing processes.

For this purpose, the process according to the invention for producing a target by thermal spraying, especially by plasma spraying by means of a plasma torch, said target comprising at least one molybdenum-based compound, is characterized in that at least one fraction of said compound in the form of a powder composition of said compound is sprayed by thermal spraying onto at least one surface portion of the target in an inert gas atmosphere, and in that powerful cryogenic cooling jets directed onto the target during its construction and distributed around the torch are used.

It will be recalled that fluids with a temperature equal to or below −150° C. are considered by definition to be cryogenic fluids.

The use during plasma spraying of cryogenic cooling jets (cryogenic liquid jets or mixed cryogenic gas/liquid jets or cryogenic gas jets) enables the quality of the target to be improved, while providing two functions:
  immediate cooling of the sprayed zone, thereby precluding any possibility of partial oxidation or nitriding (by the presence of even small traces of oxygen or nitrogen in the chamber) of the sprayed material; and
  powerful cleaning of the sprayed surface so as to provide excellent clean cohesion between the particles and successive passes.

Moreover, the use of a plasma torch and a plasma gas mixture make it possible to obtain a strong reduction in flight of the sprayed powder particles, thus reducing the oxide content present in the target compared with that present in the powder ($T_{oc} < T_{op}$ where $T_{oc}$ is the oxygen content present in the target and $T_{op}$ is the oxygen content present in the powder).

Furthermore, the process according to the invention includes the following, more conventional, aspects:
  a relative movement between the plasma torch and the target is established;
  the surface of the target is prepared prior to deposition of said compound;
  the surface preparation includes a step of blasting it with a jet of abrasive particles (called sandblasting) on the surface portion of the target in question, or alternatively a step of machining striations suitable for the keying of the sublayer; and
  the surface preparation then includes the spraying of a film of a keying material (sublayer) on the surface portion of the target in question.

In other embodiments of the invention, one and/or other of the following arrangements may furthermore be optionally employed:
  the compound is sprayed in a chamber that has been purged or rinsed and then filled with inert gas, up to a pressure that may range from 50 mbar to 1100 mbar, so as to create an oxygen-depleted atmosphere within it (% $O_2 < 5\%$);
  the thermal spraying is carried out by a plasma torch and the plasma gas mixture used is reducing (capable of reducing the oxidized molybdenum content initially present in the powder), preferably the composition of the plasma gas mixture comprising more than 10% hydrogen or another reducing plasma gas;
  a keying sublayer is used, this being deposited, before thermal spraying of said compound, on the surface portion of the target in question;
  the target is thermally regulated during the plasma spraying;
  a powder composition of said sprayed compound is used comprising powder particles with a size distribution given by $5 < D_{10} < 50$ μm; $25$ μm $< D_{50} < 100$ μm; and $40$ μm $< D_{90} < 200$ μm;
  the oxygen content present in the target in oxide form is more than 5% less than that initially present in the starting powder;
  it includes a subsequent heat treatment step in a reducing atmosphere for the purpose of reducing the oxygen content present in the target after the thermal spraying step; and
  several compound injectors are used for injecting, at different points of the thermal jet, different materials for which the injection parameters are adjusted independently according to the materials injected into each injector.

Another aspect of the invention relates to a target optionally produced by the process according to the invention and intended to be used in a sputtering device, especially a magnetron sputtering device, or in any other vacuum sputtering device using a target, said target comprising predominantly molybdenum.

For this purpose, the target, according to the invention, of nominal thickness (e), comprising at least one molybdenum-based compound, is characterized in that it has:
  a lamellar microstructure;
  an oxygen content of less than 1000 ppm, preferably less than 600 ppm, and even more preferably less than 450 ppm; and
  an electrical resistivity less than five times, preferably three times and more preferably twice the theoretical electrical resistivity of the compound.

This resistivity measurement is carried out using the Van der Pauw (ASTM F76) method, the relative resistivity measurement being calculated relative to the theoretical value at 20° C. of the passive compound (or the value obtained from the literature) (as a reminder, molybdenum has a resistivity of 5.34 μohms·cm).

In preferred embodiments of the invention, one and/or other of the following arrangements may furthermore be optionally employed:
  the target also includes at least one addition element chosen from vanadium, niobium, tantalum, chromium, tungsten, rhenium, copper, zirconium, titanium, hafnium and rhodium, the target having 0.5 to 30% by weight of the addition element or the addition elements.

In this case, the addition element or elements may be provided by one of the following means:
  use of a prealloyed powder in which each powder particle has the desired composition of the target, possibly slightly different in order to take into account any unequal losses by volatilization during the thermal spraying of the powder;
  use of a powder blend consisting, on the one hand, of pure or prealloyed molybdenum powder and, on the other hand, of one or more other pure or prealloyed powders so that the final composition of the target is that desired; and
  use of two or more powders, each being injected by a different channel into the thermal jet during the thermal spraying step.

According to another embodiment of the target, this is composed of molybdenum and silicon in molar proportions that may range from 1 mol of molybdenum per 5 mol of silicon up to 5 mol of molybdenum per 1 mol of silicon, preferably 1 mol of molybdenum per 2 mol of silicon;

the lamellar microstructure of the target is composite and comprises lamellae of pure molybdenum juxtaposed with lamellae of pure silicon;

the target has a planar geometry;

the target has a tubular geometry;

the target has additional thicknesses of material at each of its ends;

the target comprises one or more parts on which the compound is deposited; said part(s) is (are) either a planar support that can be fitted onto a sputtering machine or intermediate parts that are then bonded onto this support;

the additional thicknesses are around 25 to 50% of the nominal thickness of the compound layer;

the target has a density of greater than 85%, preferably greater than 90% (density measured according to the ISO 5016 standard);

the nominal thickness (e) is between 1 and 25 mm, preferably between 6 and 14 mm;

the target has an iron content of less than 50 ppm, preferably less than 35 ppm;

the target has an Ni content of less than 20 ppm, preferably less than 10 ppm;

the target has a Cr content of less than 50 ppm, preferably less than 20 ppm;

the target has a tungsten content of less than 300 ppm, preferably less than 200 ppm;

the target has a purity of at least 99.95%; and the target is constructed on a support material providing characteristics compatible with the expected properties of a magnetron target in use (sufficient mechanical strength, sufficient thermal conductivity, resistance to corrosion by the water for cooling the target during use, etc.), such as for example copper or a copper alloy, or austenitic stainless steel, such as for example X2CrNi18-9 or X2CrNiMo17-12-2.

According to yet another feature of the invention, this relates to a molybdenum-based or $MoSi_2$-based film obtained by sputtering the above target.

In preferred embodiments of the invention, one and/or other of the following arrangements may furthermore optionally be employed:

the molybdenum film has a resistivity of less than 25 µohms·cm, preferably less than 20 µohms·cm.

According to yet another aspect of the invention, this relates to a flat display screen, which screen may be obtained by one of the following technologies: TFT (Thin Film Transistor), LCD (Liquid Crystal Display), PDP (Plasma Display Panel), OLED (Organic Light-Emitting Diode), ILED (Inorganic Light-Emitting Diode) or FED (Field Emission Display), or else to a semiconductor component that includes at least one Mo-based or $MoSi_2$-based film, or else the invention relates to an $MoSi_2$ film that is used as a mask in the fabrication of a semiconductor component.

According to yet another aspect of the invention, this relates to at least one electrode formed from a molybdenum-based film obtained using a target as described above, this electrode being used in a photovoltaic cell or module.

According to yet another feature of the invention, this relates to a molybdenum film obtained by sputtering the above target.

In preferred embodiments of the invention, one and/or other of the following arrangements may furthermore be optionally employed:

the film has a resistivity of less than 20 µohms·cm, preferably less than 17 µohms·cm, for a film thickness of between 80 nm and 500 nm;

the film has an oxygen content of less than 250 ppm, preferably less than 220 ppm;

the film has a nitrogen content of less than 50 ppm, preferably less than 30 ppm;

the film has an iron content of less than 50 ppm, preferably less than 40 ppm;

the film has a nickel content of less than 10 ppm;

the film has a chromium content of less than 20 ppm;

the film has a tungsten content of less than 150 ppm; and the film also includes at least one addition element chosen from vanadium, niobium, tantalum, tungsten, rhenium, copper, zirconium, titanium, hafnium and rhodium, the film having 0.5 to 30% by weight of the addition element or addition elements.

BRIEF DESCRIPTION OF THE DRAWINGS

As nonlimiting examples, the invention may be illustrated by the following figures:

FIGS. 1a and 1b show a very dense structure, the interparticle connections being difficult to distinguish because of the absence of oxide lamellae;

FIG. 1c at high magnification makes it possible to distinguish the typical lamellar structure of thermal spraying processes;

FIG. 2a relates to a tubular target, its hot forming (extrusion) with unidirectional grain texturing along the extrusion direction being clearly revealed; and FIG. 2b relates to a planar target, its microstructure being conventional for sintering microstructures.

Other features and advantages of the invention will become apparent over the course of the following description.

DETAILED DESCRIPTION OF THE INVENTION

The support on which the target will be constructed may be made of copper, a copper alloy, stainless steel or any other alloy suitably compatible with the production of magnetron targets. In the present invention, no particular requirement associated with the process described in the invention is required that relates to the support such that it only has to meet the usual requirements relating to magnetron targets, in terms of geometry, mechanical strength and chemical inertness with respect to the cooling water.

Surface Preparation of the Support

After having been degreased, the surface of the support is prepared by blasting it with a jet of abrasive grains. These grains may be of various kinds: corundum (fused white alumina) grains, brown corundum grains, alumina-zirconia abrasive grains, abrasive grains produced from fuse-cast slag particles (of the Vasilgrit type), almandine garnet grains or else angular steel or cast iron shot (this list not being exhaustive).

Preferably, the following abrasives are used: corundum (fused white alumina), and alumina-zirconia (for example AZ 24 from Saint-Gobain Coating Solutions) (this material is preferred for its high toughness that limits fracturing of the grains and consequently the inclusion of grain fractions in the surface—such inclusions are deleterious to adhesion of the coating). The average diameter of the abrasive grains is preferably between 180 and 800 µm, depending on the type of abrasive. The purpose of this operation is to give a surface roughness capable of ensuring correct adhesion of the tie sublayer or of the molybdenum-based compound.

An alternative method consists in machining striations that will also allow good adhesion of the sublayer or the molybdenum compound.

Production of a Tie Sublayer by Thermal Spraying

To optimize the mechanical adhesion of the functional layer of the target, a tie sublayer may be produced by thermal spraying. This operation may employ conventional thermal spraying processes taken from the following: plasma (powder) spraying, electric-arc (wire) spraying, oxygas flame spraying (wire or powder depending on the equipment), spraying using the HVOF (high-velocity oxyfuel) process, the detonation gun spraying process and the cold spray process using an optionally preheated gas into which powder is injected. This operation may be carried out in the ambient air without this impairing the invention.

The tie sublayer material may be chosen from the conventional materials used commonly as sublayers:
  nickel or nickel-based alloys: NiAl, NiCr or NiCrAl; iron or ferrous alloys: FeCrAl, FeCrC or FeMnC steels, X2CrNi18-9 or X2CrNiMo17-12-2 austenitic stainless steels, etc.;
  copper or copper alloys, such as CuAl, CuAlFe, CuZn, etc.;
  molybdenum or molybdenum alloys: MoCu, etc.

The above list is not exhaustive, the choice of sublayer material possibly depending on the material of the support tube and on the spraying equipment (and on the availability of filler material in suitable form).

Formation of the Functional Film of the Target According to the Invention, Preferably by Plasma Spraying The functional film of the target is formed by thermal spraying, preferably by plasma spraying, under the following particular conditions:
  plasma spraying carried out in a chamber having an "inert" atmosphere, that is to say one in which the oxygen and nitrogen content is low, the atmosphere consisting predominantly of inert gas (for example argon), and the pressure in the chamber being between 50 mbar and 1100 mbar;
  plasma spraying using a reducing plasma gas mixture, making it possible to lower the amount of oxygen initially present on the surface of the powder particles upon melting them and during their flight onto the substrate;
  use, in the immediate vicinity of the plasma spray torch, of nozzles for blowing powerful liquid or gaseous cryogenic jets of an inert fluid, the jets being distributed around the torch;
  relative movements between torch and target, allowing possible variation of the thicknesses formed on the target and especially at the ends of the target by forming additional thicknesses commonly referred to as a "dog-bone" target;
  use of one or more powder injectors, allowing better distribution of the powder within the plasma jet; and
  it being possible for the plasma torch to be:
    either a commercially available DC blown-arc plasma torch;
    or an inductively coupled RF plasma torch.

The powder used to produce the target has the following typical characteristics:

defined particle size distribution such that:
  $D_{10\%}$ (diameter such that 10% of the particles are smaller in size than this diameter): between 5 and 50 µm;
  $D_{50\%}$ (median diameter): between 25 and 100 µm; and
  $D_{90\%}$ (diameter such that 90% of the particles are smaller in size than this diameter): between 40 and 200 µm;
purity according to the purity objectives for the target, preferably greater than 99.95%; and
oxygen content: <1500 ppm, preferably <1000 ppm or even <500 ppm.

Figure 1A:
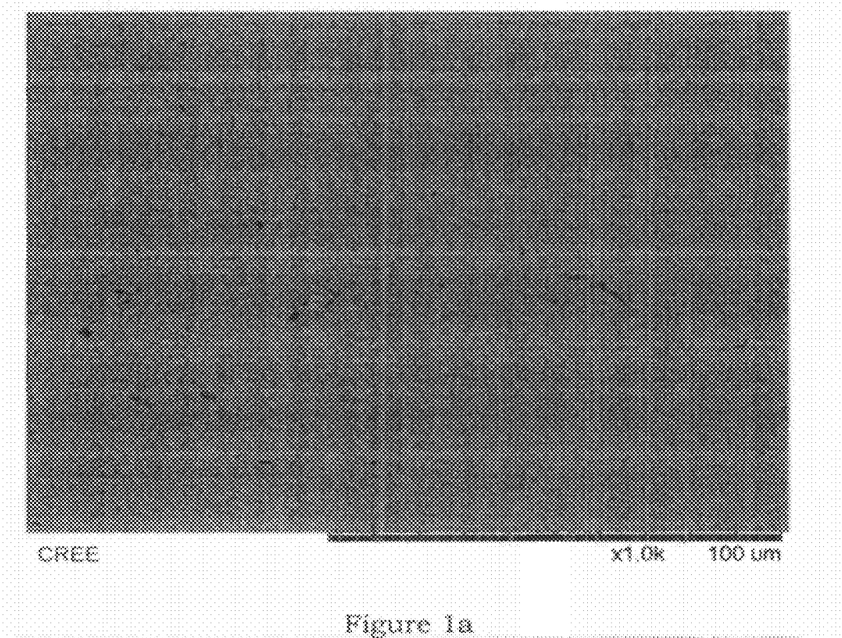
FIGS. 1a, 1b and 1c are views showing the microstructure in cross section of an Mo target obtained by the production process according to the invention.
Figure 1B:
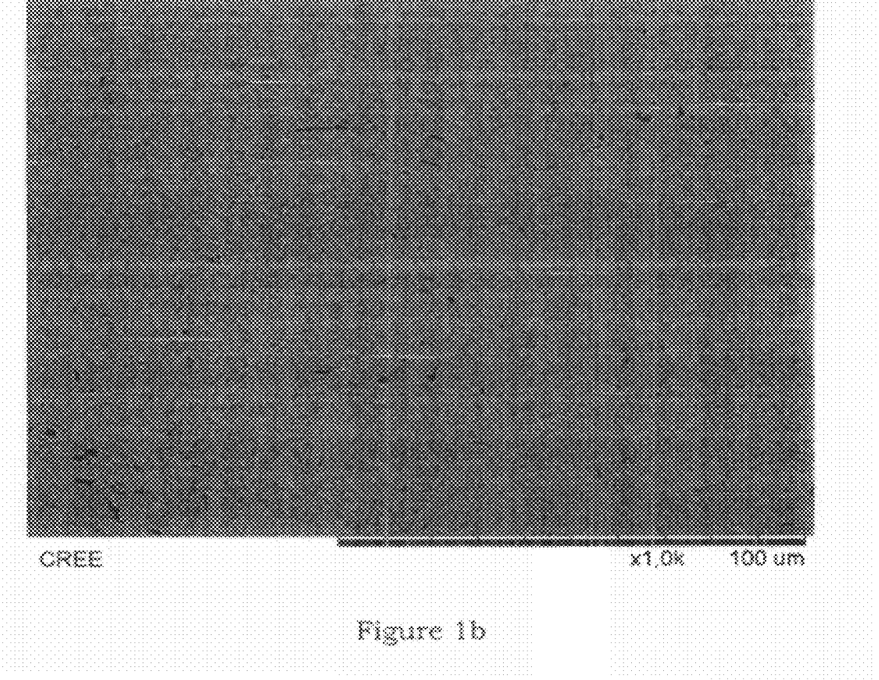
Figure 1C:
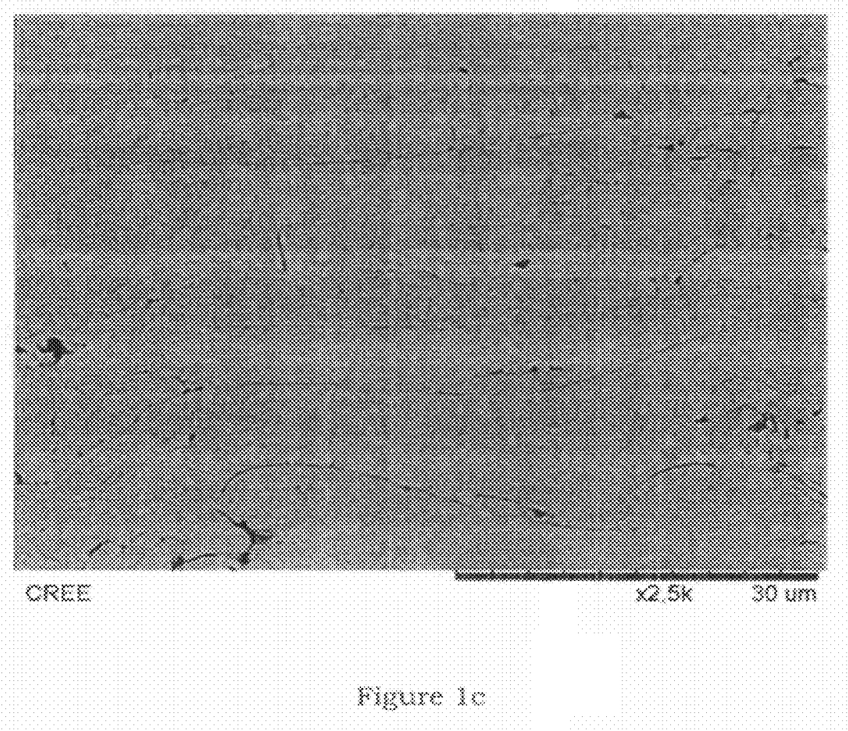
Figure 2A:
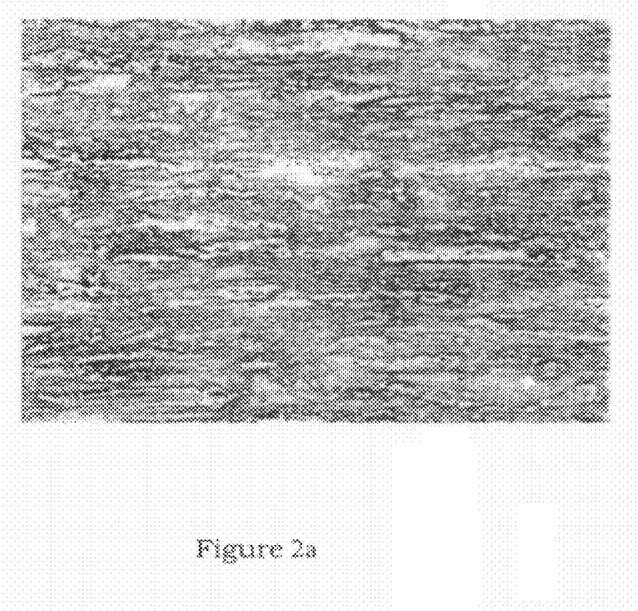
FIGS. 2a and 2b are views showing the microstructure in cross section of an Mo target obtained by conventional production processes, namely by extrusion and sintering respectively, followed by hot forming.
Figure 2B:
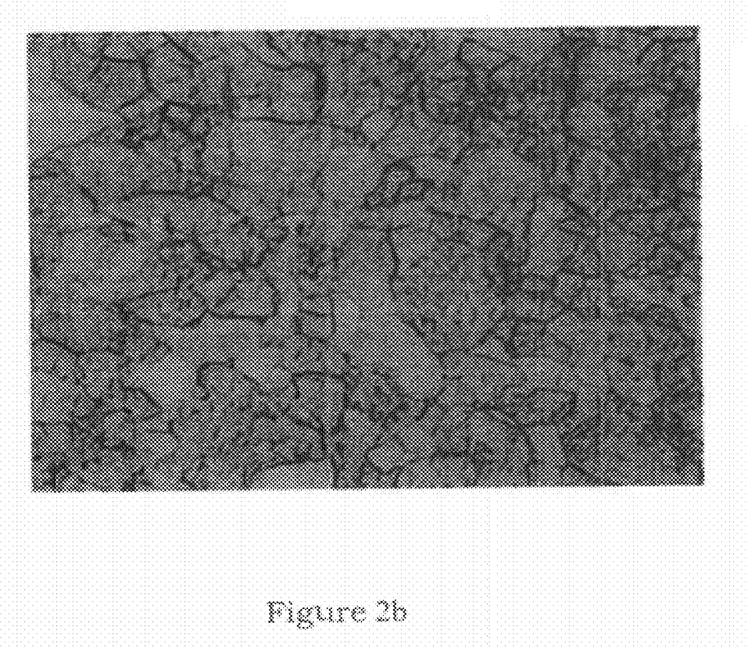

The process according to the invention makes it possible to obtain a target quality superior to that conventionally obtained by spraying and having a lamellar structure (cf. FIGS. 1a, 1b and 1c), especially in the case of pure molybdenum targets, and to obtain a target having an oxygen content of less than 500 ppm directly, without a subsequent step such as a high-temperature heat treatment in a reducing atmosphere.

The fact of not using a subsequent heat treatment step has the advantage of employing any type of material for the support (tube for a tubular target or flat support for planar targets), including supports having an expansion coefficient markedly different from that of molybdenum, such as austenitic stainless steels, which would be proscribed in the case of a subsequent heat treatment for reducing the oxygen content.

Of course, a heat treatment may also be carried out, as an option, so as to further reduce the oxygen content in the target thus produced.

Planar Target Case:

The present invention makes it possible to produce planar targets according to the following procedure:
  planar target support, suitable for being fitted into the magnetron for use;
  if the target support has a complex shape and has to be recycled after the target has been used, the target material will not be formed directly on the target support but on one or more intermediate plates (called "tiles") which will be bonded onto the support;
  the target material (molybdenum) will be formed on the support or on the tile(s) following the same procedure as above; and
  the bonding of the tile(s) may be carried out before formation of the target material (if the support has a high mechanical strength) or after formation of the target material on the tiles in the case in which the support is not strong enough. In the latter case, the dimensions of the tiles will be determined so as to minimize the risk of them being distorted during the operation of forming the target material by plasma spraying.

IMPLEMENTATION EXAMPLE

The implementation example relates to a tubular target intended to be used in magnetron sputtering with a rotating cathode. The following process was carried out:
  support tube made of austenitic stainless steel such as, for example, X2CrNi18-9 or X2CrNiMo17-12-2;
  surface preparation of the support tube by AZ grit 24 alumina-zirconia abrasive blasting;
  production of the keying sublayer by twin-arc wire spraying, carried out in air, the keying sublayer having an NiAl (95% nickel/5% aluminum) composition. In the example described, the thickness of the keying sublayer was a nominal 200 µm;

formation of the molybdenum active film on the target by plasma spraying under the following conditions:

plasma torch imparting particular plasma jet velocity characteristics and consequently sprayed particle characteristics, target placed in a chamber, use of cryogenic cooling jets directed onto the target, these being distributed around the torch, the powder used for producing the target was a molybdenum powder having the following characteristics:

agglomerated-sintered molybdenum powder
particle size $d_{50}$=80 µm
99.95% purity, with in particular 20 ppm of Fe and 600 ppm of oxygen and plasma spraying carried out with the following parameters:

a plasma torch with the following parameters was used to produce the target of the example:

| Parameter | Ar flow rate (slpm) | $H_2$ flow rate (slpm) | Arc current (A) | Spraying distance (mm) | Powder flow rate (g/min) |
|---|---|---|---|---|---|
| Value | 50 | 14 | 600 | 160 | 160 | surface finishing by polishing or machining so as to obtain a roughness such that $R_{max}$<15 µm.

As indicated above, thanks to the specific process according to the present invention, the oxygen content in the target obtained was 330 ppm, less than the 600 ppm content initially present in the powder. The essential characteristics of the target obtained are given in the following table (Target Example 4).

Additional results according to this protocol with different powder compositions, in comparison with a result without a cryogenic jet according to the invention, are given in the table below:

| Trial reference | Process | Oxygen content in the powder | Nitrogen content in the powder | Oxygen content in the target | Nitrogen content in the target |
|---|---|---|---|---|---|
| A | According to the invention | 657 | 18 | 340 | 20 |
| B | According to the invention | 657 | 18 | 240 | 20 |
| C | According to the invention | 922 | 26 | 340 | 23 |
| D | According to the invention | 526 | 29 | 360 | 18 |
| E | According to the invention | 526 | 29 | 360 | 19 |
| F | According to the invention | 706 | 31 | 580 | 30 |
| G | No cooling jets | 560 | 29 | 960 | 83 |

As the above results show, the plasma spraying process with cryogenic cooling jets distributed around the plasma torch makes it possible to reduce the oxygen content in the target compared with the oxygen content in the starting powder. It is thus unnecessary to choose a very pure starting powder, especially since it is not possible in practice to avoid the powder containing a certain amount of oxygen. The process according to the invention is thus particularly advantageous.

Properties and Advantages of the Invention

The targets according to the present invention have the following properties and advantages:

better utilization factor of the material used in tubular targets obtained by plasma spraying compared with those obtained by the sintering followed by hot-forming processes because the process according to the present invention offers the possibility of depositing additional thickness at the ends of the targets so as to compensate for the extensive localized erosion in the zones corresponding to the bending, with a small radius of curvature, of the magnetic field created by the cathodes and their magnets. This makes it possible to achieve target material yields greater than 75%, or even 80%, whereas the yields remain below 75% in flat-profile targets. As a corollary to using this type of target, films, especially molybdenum-based films, are obtained whose $R_\square$uniformity profile, along a characteristic dimension of the substrate at the surface of which the film was deposited, deviates by no more than ±2% (for example on a substrate of 3.20 m width). This measurement is carried out using an apparatus of the "Nagy" type by contactless measurement;

wide material thickness range on the target between 1 and 25 mm: the thickness of the target may be chosen according to the desired lifetime thereof (this thickness being in fact determined by the expected duration of production without stopping the line);

in the case of tubular targets, it is possible to bias the target in AC mode or DC mode with power levels in excess of 30 kW/m (increase in deposition rate), without the risk of cracking (due to the thermal gradient between the support tube and the target) or the risk of braze melting; and because the molybdenum thickness is reduced to the amount strictly necessary for the user, it is possible to limit the voltage needed to sustain the high-power discharge and thus make this target compatible with current magnetron power supplies.

In the case of monolithic tubular or planar targets produced using the present invention, and in contrast with targets comprising assembled segments, the following risks are considerably reduced:

risk of the appearance of arcing, which generates parasitic particles, and the risk of fragments of the target material being separated from its support, which is known to be a source of contamination of the molybdenum films;

risk of sputtering braze material or target support material via the gaps between segments; and risk of thermal or mechanical failure of the bonding (braze or conductive cement) to the support.

The targets according to the invention are particularly intended to be used in a vacuum film deposition installation (magnetron sputtering in an inert or reactive atmosphere, especially by magnetron cathode sputtering, by corona discharge or by ion beam sputtering), for the purpose of obtaining a film based on the material forming said target, this film being molybdenum-based.

This molybdenum-based film may be deposited directly on a substrate or indirectly on another film which is itself in contact with a substrate, it being possible for the substrate to be of organic nature (PMMA or PC) or of inorganic nature (silica-based glass, metal, etc.).

This thin film may form an electrode for a photovoltaic cell or panel, or else it may form part of the constitution (interconnects, etc.) of display screens using TFT, LCD, OLED, ILED or FED technologies, or any other assembly requiring a thin molybdenum film of good quality.

The films forming the subject matter of the following examples were obtained by magnetron sputtering of various targets obtained according to the prior art (Examples 1 and 3) and according to the invention (Examples 4 and 5):

nents for fastening the target (i.e. clamps) and therefore eliminates any possibility of parasitic sputtering above the glass.

In most applications, the resistivity of the thin Mo film is especially governed by the oxygen content in the film. It is particularly important to minimize this content so as to maintain a minimum level of oxidation of the film and therefore to obtain a resistivity close to that of pure metallic molybdenum.

The oxygen content of the film has two origins: (i) oxygen originating from the residual atmosphere ("basic vacuum") before introduction of the sputtering gas and (ii) oxygen originating from the target.

| | | Magnetron target | | | | Deposition process | | Mo thin film | |
|---|---|---|---|---|---|---|---|---|---|
| Example | Process | Thickness (mm) | O (ppm) | Fe (ppm) | Resistivity ($\mu$ohms · cm) | Power (kW/m) | Pressure ($\mu$bar) | Thickness (nm) | Resistivity ($\mu$ohms · cm) |
| 1 | Sintering | 9 | <50 | 60 | 5.6 | 30 (AC) | 4 | 88 | 19.6 |
| 2 | Sintering | 12.5 | <50 | 50 | 6 | 10 (DC) | 4 | 180 | 18.8 |
| 3 | Plasma spray (prior art) | 2.2 | >700 | ? | — | 20 (DC) | 2 | 172 | 24.7 |
| 4 | Plasma spray | 9 | 330 | 9 | 8.4 | 30 (AC) | 4 | 88 | 19.0 |
| 5 | Plasma spray | 4 | 300 | 15 | 8.5 | 20 (DC) | 2 | 120 | 14.0 |

The thin molybdenum-based films were deposited on extra-clear glass 3 mm in thickness, of the SGG-Diamant extra-clear glass type. These films were deposited in a horizontal magnetron deposition machine provided with a molybdenum target according to the invention, this target being supplied either in AC mode by a Hüttinger BIG150 power supply or in DC mode by a Pinnacle AE power supply, with an argon plasma of 450 sccm argon in the case of Examples 1 and 4 and 600 sccm argon for Examples 2, 3 and 5.

Comments:

Example 4 versus Example 1 and Example 5 versus Example 2: identical or better performance for the target of the invention compared with a high-purity target of the prior art. For an oxygen content <450 ppm in the target, the oxygen content (and therefore the resistivity) in the film is governed by the limiting vacuum in the deposition chamber (amount of oxygen available under the residual pressure);

Example 5 versus Example 3: better performance in the target according to the invention compared with the target according to the prior art. When the oxygen content in the target exceeds 500 ppm, the oxygen content in the film is governed by the purity of the target.

The targets described in Examples 4 and 5 generate a perfectly stable plasma under DC or AC bias without significant arcing throughout the lifetime of the target.

As a variant, if a target possibly obtained by the process according to the invention is sputtered, this target possibly containing at least one metal cation belonging to the (Fe, Ni, Cr, W, etc.) family, a film also having a certain content of these elements is obtained.

The content of cationic impurities in a thin film produced from a rotary target stems practically only from the target. This is because the rotary technology eliminates all compo- Thus, it is possible to calculate the amount of oxygen theoretically included in the molybdenum film, coming from the residual oxygen partial pressure in the sputter coater, using the following:

$J_{O2}$ (the oxygen flux reaching the glass during deposition)=$3.51 \times 10^{22} (M_{O2} \times T)^{-1/2} \times P$, where $M_{O2}$ is the molecular weight of the oxygen gas, T is the temperature in kelvin and P is the pressure in torr and $J_{Mo}$ (the amount of MO on the glass that can react with $O_2$)=$V_{Mo} \times N_{Mo}$, where $V_{Mo}$ is the Mo deposition rate (in cm/s) and $N_{Mo}$ is the amount of Mo atoms per $cm^3$ in a magnetron metal film (in atoms/$cm^3$).

Assuming that all the oxygen coming into contact with the molybdenum on the substrate reacts, it is possible to calculate the maximum expected oxygen content in the Mo film; for a given deposition rate on sputter coaters of $8 \times 10^{-7}$ cm/s, the residual oxygen contents in the Mo layer as a function of the residual oxygen partial pressure are obtained as given in the following table:

| $pO_2$ (mbar) in the sputtering atmosphere | Calculated oxygen content coming from the vacuum in the Mo film (ppm) |
|---|---|
| $10^{-7}$ | 1000 |
| $5 \times 10^{-8}$ | 540 |
| $2 \times 10^{-8}$ | 250 |
| $1 \times 10^{-8}$ | 110 |
| $5 \times 10^{-9}$ | 54 |

The minimum residual partial pressure measured in the sputter coater is conventionally $5 \times 10^{-8}$ mbar, i.e. about 540 ppm theoretical oxygen. It is therefore unnecessary to use high-purity targets with an oxygen content well below 540 ppm since the influence of the target on the purity of the final film is masked by the oxygen coming from the atmosphere in the sputter coater. The invention consists in choosing a less expensive magnetron technology for producing Mo targets, the oxygen content of which is less than 1000 ppm, preferably less than 600 ppm and even more preferably less than 450 ppm.

The residual content of metal cations (Fe, Ni, Cr, W, etc.) of the thin Mo film obtained within the context of the invention is less than that of the films obtained by conventional targets, for two reasons:

the film of the invention is obtained by sputtering a monolithic target (one single segment): no risk of sputtering the backing tube (made of titanium or stainless steel) or the material used for bonding the Mo to the backing tube (for example indium); and the film of the invention is obtained by sputtering a target of high purity in terms of metal cations, this being dependent on the choice of technology for producing the target and on its implementation: choice of a raw material powder of high purity and forming of the target by plasma spraying, i.e. without direct contact between the sprayed molybdenum and metal parts, as in extrusion or hot-rolling techniques, or contact with metal parts based on steel, stainless steel, tungsten, etc. are possible.

The molybdenum film according to the invention typically has:

an iron content of less than 50 ppm, preferably less than 40 ppm; and/or a nickel content of less than 10 ppm; and/or a chromium content of less than 20 ppm; and/or a tungsten content of less than 150 ppm.

The invention claimed is:

1. A target, consisting of molybdenum and inevitable impurities,
wherein the target is obtained by a process comprising thermal spraying, and
wherein the target has:
a lamellar microstructure;
an oxygen content of less than 600 ppm;
an electrical resistivity less than five times the theoretical electrical resistivity of molybdenum; and
a nominal thickness of between 1 and 25 mm.

2. The target of claim 1, having a planar geometry.

3. The target of claim 1, having a tubular geometry.

4. A target comprising the target of claim 3 and additional thicknesses of material at each of its ends.

5. A target comprising the target of claim 2 and a part on which the molybdenum is deposited, wherein the part is a planar support configured to be fitted onto a sputtering machine and optionally an intermediate part that is bonded onto the support.

6. The target of claim 4, wherein the additional thicknesses are 25 to 50% of a nominal thickness of a compound layer.

7. The target of claim 1, having a density of greater than 85%.

8. The target of claim 1, having a nominal thickness between 6 and 14 mm.

9. The target of claim 1, having an iron content of less than 50 ppm.

10. The target of claim 1, having a purity of at least 99.95%.

11. The target of claim 1, wherein the target is obtained by a process comprising thermal spraying and directing cryogenic cooling jets distributed around a torch onto the target during spraying.

* * * * *